US012572051B2

(12) United States Patent
Stenstrom et al.

(10) Patent No.: US 12,572,051 B2
(45) Date of Patent: Mar. 10, 2026

(54) DEVICE AND METHOD FOR CONTROLLING FOCUS OF A LASER BEAM

(71) Applicant: Mycronic AB, Taby (SE)

(72) Inventors: Pontus Stenstrom, Akersberga (SE); Anders Svensson, Sollentuna (SE); John-Oscar Larson, Jarfalla (SE)

(73) Assignee: Mycronic AB, Taby (SE)

( * ) Notice: Subject to any disclaimer, the term of this patent is extended or adjusted under 35 U.S.C. 154(b) by 500 days.

(21) Appl. No.: 18/001,006

(22) PCT Filed: Jun. 29, 2021

(86) PCT No.: PCT/EP2021/067850
§ 371 (c)(1),
(2) Date: Dec. 7, 2022

(87) PCT Pub. No.: WO2022/002937
PCT Pub. Date: Jan. 6, 2022

(65) Prior Publication Data
US 2023/0221615 A1 Jul. 13, 2023

(30) Foreign Application Priority Data
Jul. 3, 2020 (EP) ..................................... 20183909

(51) Int. Cl.
*G02F 1/33* (2006.01)
*G03F 7/00* (2006.01)

(52) U.S. Cl.
CPC ............ *G02F 1/33* (2013.01); *G02F 2203/28* (2013.01); *G03F 7/70383* (2013.01)

(58) Field of Classification Search
CPC .............. G02F 1/33; G02F 1/332; G02F 1/35; G02F 1/3503; G02F 1/3515; G02F 1/353; G02F 1/3532; G02F 1/3538
See application file for complete search history.

(56) References Cited

U.S. PATENT DOCUMENTS 5,890,789 A * 4/1999 Inagaki ................... G02F 1/113
359/305
2002/0181119 A1 12/2002 Sullivan et al.
(Continued)

FOREIGN PATENT DOCUMENTS

JP S51-029935 A 3/1976
JP 2004-535596 A 11/2004
(Continued)

OTHER PUBLICATIONS

Kaplan A et al, "Acousto-Optic Lens With Very Fast Focus Scanning", Optics Letters, Optical Society of America, US, vol. 26, No. 14, Jul. 15, 2001 (Jul. 15, 2001) , pp. 1078-1080.
(Continued)

*Primary Examiner* — Sharrief I Broome
*Assistant Examiner* — Journey F Sumlar
(74) *Attorney, Agent, or Firm* — Harness, Dickey & Pierce, P.L.C.

(57) ABSTRACT

A device, a computer program, a computer readable medium and a method for controlling focus of a laser beam during a micro sweep are disclosed. The laser beam is received to an acousto-optic deflector, and acoustic waves are provided to the acousto-optic deflector. The acoustic waves are varied in frequency over time to vary a deflection angle of the laser beam over time thereby achieving the micro sweep of the laser beam. Furthermore, a rate of variation in frequency of the acoustic waves is adapted over a time of the micro sweep in such a way that differences in frequencies over the time of the micro sweep of the acoustic waves are caused in the acousto-optic deflector over a width of the laser beam in a direction parallel to the micro sweep when passing through the acousto-optic deflector, where the differences in frequencies over the time of the micro sweep are such that they cause a desired focus of the laser beam in a direction parallel with the micro sweep over the micro sweep.

12 Claims, 4 Drawing Sheets

(56)                References Cited

U.S. PATENT DOCUMENTS

| | | | |
|---|---|---|---|
| 2003/0202236 A1* | 10/2003 | Khoshnevisan ... | G02B 26/0875 |
| | | | 359/305 |
| 2006/0071143 A1* | 4/2006 | Saggau .................. | G02B 27/30 |
| | | | 250/201.3 |
| 2010/0328759 A1 | 12/2010 | Kirkby et al. | |
| 2012/0281195 A1 | 11/2012 | Sandstrom | |
| 2015/0085346 A1* | 3/2015 | Rozsa .................. | G02B 26/101 |
| | | | 359/310 |
| 2015/0338718 A1* | 11/2015 | Zhang ...................... | G02F 1/33 |
| | | | 359/305 |
| 2016/0313256 A1 | 10/2016 | Sullivan et al. | |

FOREIGN PATENT DOCUMENTS

| | | |
|---|---|---|
| JP | 2013-539069 A | 10/2013 |
| WO | 2012/028610 A1 | 3/2012 |

OTHER PUBLICATIONS

Peter Bechtold et al, "Beam Shaping and High-Speed, Cylinder-Lens-Free Beam Guiding Using Acousto-Optical Deflectors Without Additional Compensation Optics", Opt! cs Express, vol. 21, No. 12, Jun. 12, 2013 (Jun. 12, 2013) , p. 14627.
Vanderlugt A et al, "Design Relationships for Acousto-Optic Scanning Systems", Applied Optics, Optical Society of America, Washington, DC, US, vol. 31, No. 20.
International Search Report for International Application No. PCT/EP2021/067850 dated Oct. 7, 2021.

* cited by examiner

DEVICE AND METHOD FOR CONTROLLING FOCUS OF A LASER BEAM

TECHNICAL FIELD

The present disclosure relates to acousto-optic deflectors, and specifically to controlling focus of a laser beam deflected by means of an acousto-optic deflector.

BACKGROUND

In the area of pattern generation, such as in mask printing, acousto-optic deflectors may be used for causing deflection of one or more optical beams when printing a pattern in a photo-sensitive resist. Acousto-optic deflectors include a transparent material, such as a crystal material, which is subjected to acoustic waves at a frequency causing compressions and depressions in the material. Provided that acoustic waves with a wavelength sufficiently shorter than the wavelength of light of an optical beam passing through the material at angle that depends on the frequency of the acoustic waves, this in turn causes the material to act as a grating that deflects the optical beam. Generally, the amount of deflection, i.e. a deflection angle, is proportional to the frequency of the acoustic waves. Hence, by increasing the frequency of the acoustic waves over time the deflection angle can be increased thereby causing a sweep (called micro sweep herein) of the optical beam over a portion of the photo sensitive resist to be exposed in accordance with a desired pattern.

SUMMARY

The inventors have realised that a problem with prior art pattern generators using acousto-optic deflectors is that a focus of a laser beam in a direction parallel with a micro sweep direction varies over the length of the micro sweep such that in at least some portions of the micro sweep, the optical beam is not in correct focus in the direction parallel with the micro sweep. This will introduce errors in a printed pattern resulting from the modulated laser beam over the micro sweep. The focus will vary even more when a length of the micro sweep is increased.

According to a first aspect a method of controlling focus of a laser beam during a micro sweep is provided. The method comprises receiving the laser beam to an acousto-optic deflector and providing acoustic waves to the acousto-optic deflector, wherein the acoustic waves are varied in frequency over time to vary a deflection angle of the laser beam over time thereby achieving the micro sweep of the laser beam. A rate of variation in frequency of the acoustic waves is adapted over a time of the micro sweep in such a way that adapted differences in frequencies of the acoustic waves are caused in the acousto-optic deflector over a width of the laser beam in a direction parallel to the micro sweep when passing through the acousto-optic deflector, where the adapted differences in frequencies over the time of the micro sweep are such that they cause a desired focus of the laser beam in a direction parallel with the micro sweep over the micro sweep.

The term micro sweep is used here to denote the sweep of the laser beam along a path on a surface (e.g. including a photo-sensitive resist) to be exposed as the deflection angle of the laser beam varies by means of varying the acoustic waves in frequency through the acousto-optic deflector. The deflection angle varies over the micro sweep from a starting angle at a starting frequency of the acoustic waves to an end angle at an end frequency of the acoustic waves.

The differences in frequencies of the acoustic waves caused in the acousto-optic deflector over a width of the laser beam in a direction parallel to the micro sweep, are caused by the variation of the acoustic wave in frequency over time. At a given moment in time, acoustic waves that have travelled longer into the acousto-optic deflector, i.e. for a longer time, affecting some portion of the width of the laser beam will have a different frequency than other acoustic waves that have travelled shorter into the acousto-optic deflector, i.e. for a shorter time, affecting another portion of the width of the laser beam. Hence, there will be a momentary difference in frequency. Also, as the deflection angle will vary to achieve the micro sweep in a direction parallel to the direction of propagation of the acoustic waves, the differences will be in a direction parallel to the micro sweep.

The desired focus of the laser beam in a direction parallel with the micro sweep is referring to a focus of the laser beam in a direction parallel with the micro sweep at a photo sensitive resist to be exposed. By desired is meant a focus that is desired for a particular application. Typically, a uniform (constant) focus is desired over the micro sweep. Such a focus may also be referred to as a correct focus.

The inventors have realised that varying speed (rate) of the variation of the acoustic waves in frequency over time will affect the differences in frequencies of the acoustic waves over the width of the laser beam in the direction parallel to the micro sweep when passing through the acousto-optic deflector and that these differences in frequencies will affect the focus of the laser beam in the direction parallel with the micro sweep. Hence, the speed (rate) of the variation (increase or decrease) can be adapted (calibrated) over the micro sweep (i.e. over time) such that a desired focus of the laser beam in the direction parallel with the micro sweep can be achieved over the micro sweep.

The rate of variation of frequency of the acoustic waves is preferably adapted over the time of the micro sweep in such a way the adapted differences in frequencies are such that they cause the desired focus of the laser beam in the direction parallel with the micro sweep over the entire micro sweep. By calibrating the variation of the frequency over time the desired focus can be achieved in every point, or for every pixel, along the micro sweep.

Furthermore, the rate of variation in frequency of the acoustic waves is preferably adapted over the time of the micro sweep according to a function which in each moment in time over the time of the micro sweep causes a difference in frequencies of the acoustic waves in the acousto-optic deflector over a width of the laser beam in a direction parallel to the micro sweep when passing through the acousto-optic deflector, where the difference in frequencies is such that it causes a desired focus of the laser beam in a direction parallel with the micro sweep. A function is here meant generally as a relationship between the frequency and time. The function may for example be in the form of a table mapping a frequency for a set of consecutive points in time (corresponding to consecutive time intervals), such that the frequency is varied by stepwise increase in consecutive points of time and kept constant during a time interval after each consecutive point in time. The time intervals may be made very small such that the stepwise function will become almost a continuous function.

The laser beam is typically modulated over time according to a predetermined pattern to be used for printing on a photo-sensitive resist along the micro sweep. Varying the acoustic waves in frequency over time to achieve the desired focus of the laser beam in the direction parallel with the micro sweep will result in position nonlinearities for the micro sweep (non-linear micro sweep), i.e. the position of the laser beam in the micro sweep will not vary as a linear function of time. Such position nonlinearities need to be taken into account in order for printing to be at correct positions of the photo-sensitive resist according to the predetermined pattern.

In an example, the modulation of the laser beam may be adapted to compensate for a change of position (position nonlinearities) within the micro sweep due to the acoustic waves being varied in frequency over time in such a way that the desired focus of the laser beam in a direction parallel with the micro sweep is caused. Hence, given the non-linear micro sweep calibrated to provide a desired focus of the laser beam in the direction parallel with the micro sweep, a difference (position deviation) to a linear micro sweep can be derived and the modulation could then be adapted based on the identified difference (position deviation).

Furthermore, the introduced position nonlinearities (non-linear sweep) will result in varying speed of the micro sweep (speed of the laser beam along the micro sweep, i.e. along the surface to be exposed) which in turn will affect the dose delivered along the sweep. This may be taken into account by adapting an intensity of the laser beam over the micro sweep to compensate for the change of speed of the micro sweep due to the acoustic waves being varied in frequency over time in such a way that the desired focus of the laser beam in a direction parallel with the micros sweep is caused. For example, the intensity may be proportional to the speed of the micro sweep, i.e. the intensity is increased in portions of the micro sweep where the speed of the micro sweep is increased, and the intensity is decreased in portions of the micro sweep where the speed of the micro sweep is decreased.

According to a second aspect, a computer program is provided comprising computer readable instructions that, when executed on a processing device, cause the processing device to perform the method of the first aspect.

The computer program of the second aspect may further include additional features corresponding to the additional features described in relation to the method of the first aspect.

According to a third aspect, a computer readable media is provided having stored thereon a computer program comprising computer readable instructions that, when executed on a processing device, cause the processing means to perform the method of the first aspect.

The computer readable media of the third aspect may further include additional features corresponding to the additional features described in relation to the method of the first aspect.

The computer readable media of the third aspect may for example be a non-transitory computer readable media.

According to a fourth aspect, a device for projection of a laser beam onto a surface, such as a photo-sensitive resist, is provided. The device comprises an acousto-optic deflector arranged to receive the laser beam, and an acoustic transducer arranged to provide acoustic waves to the acousto-optic deflector. The device further comprises a control unit arranged to vary the acoustic waves in frequency over time to vary a deflection angle of the laser beam over time thereby achieving the micro sweep of the laser beam. The control unit is further arranged to adapt a rate of variation of frequency of the acoustic waves over a time of the micro sweep in such a way that adapted differences in frequencies over the time of the micro sweep of the acoustic waves in the acousto-optic deflector are caused over a width of the laser beam in a direction parallel to the micro sweep when passing through the acousto-optic deflector, where the adapted differences in frequencies over the time of the micro sweep are such that they cause a desired focus of the laser beam in a direction parallel with the micro sweep over the micro sweep.

The device of the fourth aspect may further include additional features corresponding to the additional features described in relation to the method of the first aspect.

BRIEF DESCRIPTION OF THE DRAWINGS

Examples will be described below with reference to the accompanying drawings in which.

All the figures are schematic and generally only show parts which are necessary in order to elucidate the respective examples, whereas other parts may be omitted or merely suggested.

DETAILED DESCRIPTION

The method and device of the present disclosure may advantageously be implemented in a pattern generator wherein at least one laser beam is modulated according to pattern data. The modulated laser beam is projected onto a photo-sensitive resist using an acousto-optic deflector.

Figure 1A:
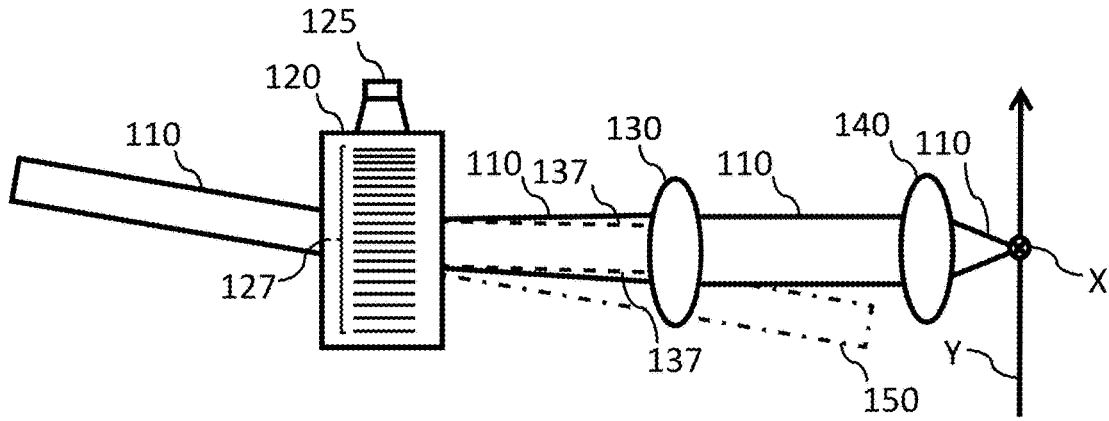
FIG. 1a and FIG. 1b show perpendicular views of a schematic set-up in which the method and the device of the present disclosure can be implemented.
Figure 1B:
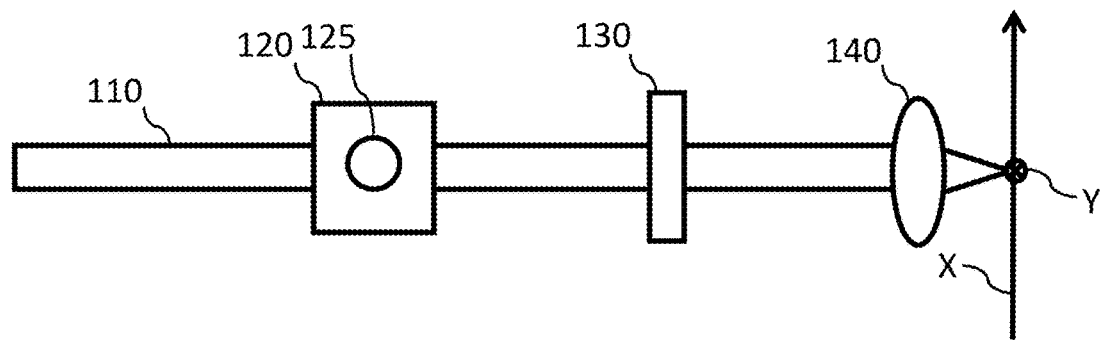

FIG. 1a and FIG. 1b show perpendicular views of a schematic set-up in which the method and the device of the present disclosure can be implemented. The setup may for example represent a portion of the elements of a pattern generator.

In FIG. 1a, a (modulated) laser beam 110 passes through an acousto-optic deflector 120. An acoustic transducer 125 produces and provides acoustic waves 127 to the acousto-optic deflector 120. A deflection angle of the laser beam 110 out from the acousto-optic deflector 120 will depend on a frequency of the acoustic waves 127 (and the incoming angle of the laser beam 110). Generally, the amount of deflection, i.e. a deflection angle, is proportional to a frequency of the acoustic waves. Hence, by increasing (or alternatively decreasing) the frequency of the acoustic waves over time the deflection angle can be increased (or alternatively decreased) thereby causing a sweep of the laser beam over a portion of a photo-sensitive resist onto which a pattern is to be printed. Such a sweep is called a micro sweep in the present disclosure. The micro sweep will be in a first direction Y which is parallel to the propagation direction of the acoustic waves. Printing is typically performed in the form of pixels, such as for example 1500 pixels along a micro sweep. The pattern has been rasterised to produce pattern data defining laser exposure in relation to each pixel.

The acoustic waves may for example be varied in frequency from 125 to 260 MHz, or from 210 to 420 MHz. The length of the micro sweep would typically be in the order of 200 μm. It is to be noted that the frequency ranges of the acoustic waves and the length of the micro sweeps are only provided as examples, any other frequency ranges and sweep lengths can be used as long the desired micro sweep can be achieved given the properties of the laser to be used for producing the laser beam.

In addition to deflecting the laser beam 110, the acousto-optic deflector 120 will also defocus the laser beam 110 in the first direction Y. This can be seen in FIG. 1a in that the laser beam 110 diverges after deflection in accordance shape of the laser beam 110 in the first direction Y illustrated by the solid outer lines as compared to the original shape of the laser beam 110 in the first direction Y illustrated by the dashed lines 137. A cylindrical lens 130 is provided after the acousto-optic deflector 120. The cylindrical lens 130 is so arranged that it focuses the laser beam 110 in the first direction Y to compensate for the defocusing of the laser beam in the first direction Y caused by the acousto-optic deflector 120.

A further lens 140 is arranged to focus the laser beam 110 in the first direction Y on the photo-sensitive resist.

In FIG. 1b, the set-up of FIG. 1a is illustrated in a view perpendicular from the view of FIG. 1a. A second direction X is perpendicular to the first direction Y. In the second direction X no deflection of the laser beam 110 will occur in the second direction X when the laser beam passes through the acousto-optic deflector. Similarly, no defocusing of the laser beam 110 is caused by the acousto-optic deflector 120 in the second direction X. Hence, the cylindrical lens 130 is so arranged that it leaves the focus of the laser beam in the second direction X unaffected. Movement of the laser beam in the second direction X in relation to the photo-sensitive resist may be achieved by movement of the photo-sensitive resist, or rather movement of the substrate on top of which the photo-sensitive resist is formed as a thin layer, in an opposite direction to the second direction X.

The further lens 140 is further arranged to focus the laser beam 110 in the second direction X on the photo-sensitive resist.

Figure 2:
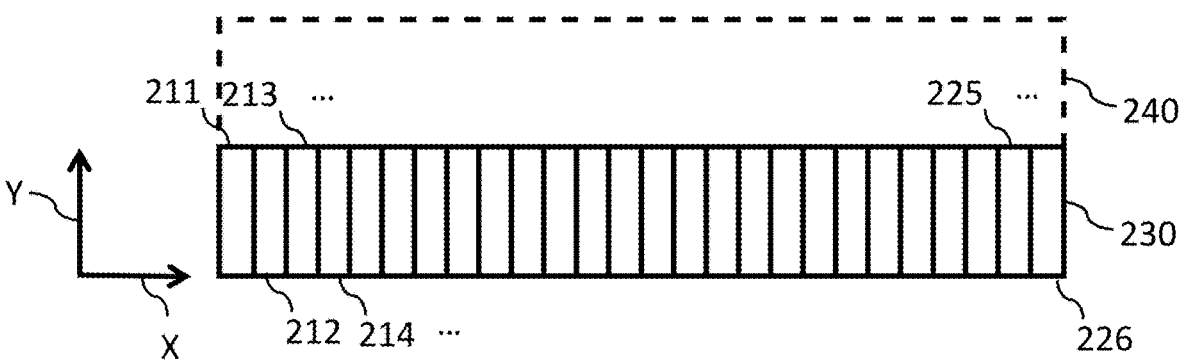
FIG. 2 shows an illustration of a portion of a photo-sensitive resist with indication of micro sweeps in a first direction on a strip extending in a second perpendicular direction for which the method and the device of the present disclosure can be implemented.

FIG. 2 shows an illustration of a portion of a photo-sensitive resist with indication of micro sweeps 211, 212, 213, 214, . . . , 225, 226 in the first direction Y along a first strip 230 in the second direction X perpendicular to the first direction Y.

The micro sweeps 211, 212, 213, 214, . . . , 225, 226 in the first direction Y indicated in FIG. 2 may be printed by means of successive micro sweeps of a single laser beam in the first direction Y and moving the photo-sensitive resist one micro sweep width in the opposite direction to the second direction X during the time it takes to perform one micro sweep. In alternative the micro sweeps 211, 212, 213, 214, . . . , 225, 226 in the first direction Y may be printed by means of successive micro sweeps of n parallel laser beams in Y direction and intermediate moving n micro sweep widths in the direction opposite to the second direction X. The n parallel laser beams may be created by means of a beam splitter.

Once printing has been performed along all micro sweeps 211, 212, 213, 214, . . . , 225, 226, i.e. along the whole first strip 230, the printing should proceed to a second strip 240. This may be achieved by moving the photo-sensitive resist in the second direction X a first length corresponding to a length of the first strip 230 and moving the photo-sensitive resist in a direction opposite or equal to the first direction Y a second length corresponding to a width of the first strip 230, i.e. the length of each micro sweep of the micro sweeps 211, 212, 213, 214, . . . , 225, 226.

It is to be noted that FIG. 2 is only provided illustrate example principles for printing a pattern onto a photo-sensitive resist based on micro sweeps and strips. The number of micro sweeps and relative dimensions of the micro sweeps and the strips are not intended to reflect a real result.

Figure 5A:
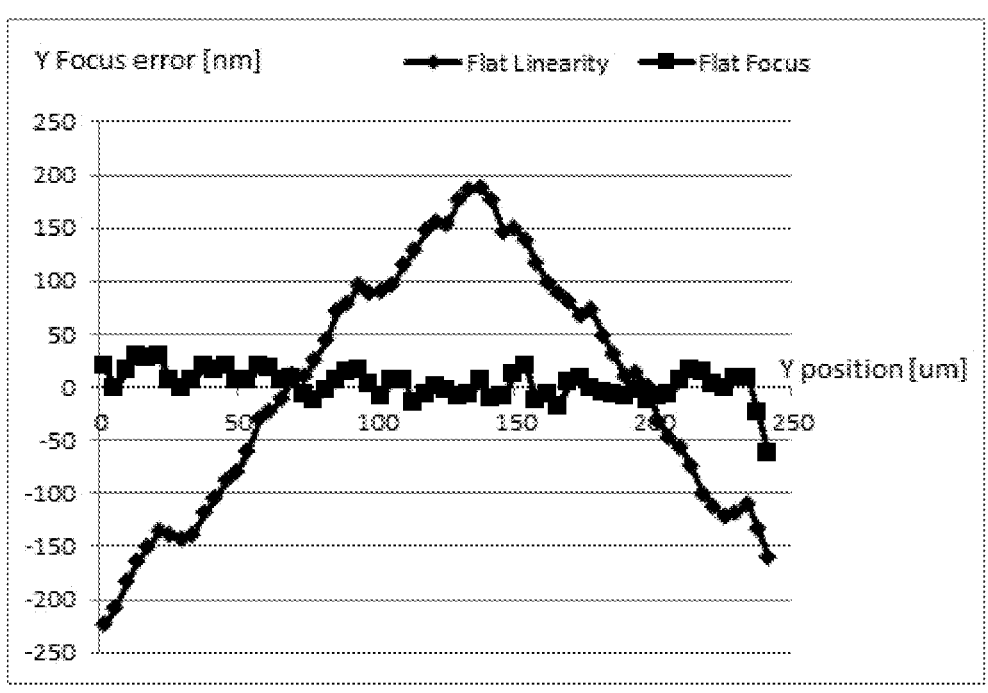
FIG. 5a shows focus error along a micro sweep of a laser beam in a first direction parallel to the micro sweep for a case where calibration has been made to achieve a linear sweep and for a case where calibration has been made to achieve a desired focus in the first direction.

In prior art, pattern generators have been calibrated to produce a linear micro sweep, i.e. a micro sweep with constant speed of the laser beam over the photo-sensitive resist during the micro sweep. To achieve a linear micro sweep, the rate of variation (increase or decrease) of frequency of the acoustic waves provided to the acousto-optic deflector has to be tuned in relation to constant rate. The inventors have shown that such calibration will result in inaccuracies in a printed pattern and that such inaccuracies are due to erroneous focus in the direction parallel with the micro sweep, i.e. the first direction Y as illustrated in FIGS. 1a, 1b and 2. This is illustrated in FIG. 5a where focus error in the first direction Y is illustrated for a case where calibration has been made to achieve a linear micro sweep as indicated by the curve designated "Flat Linearity".

Figure 3:
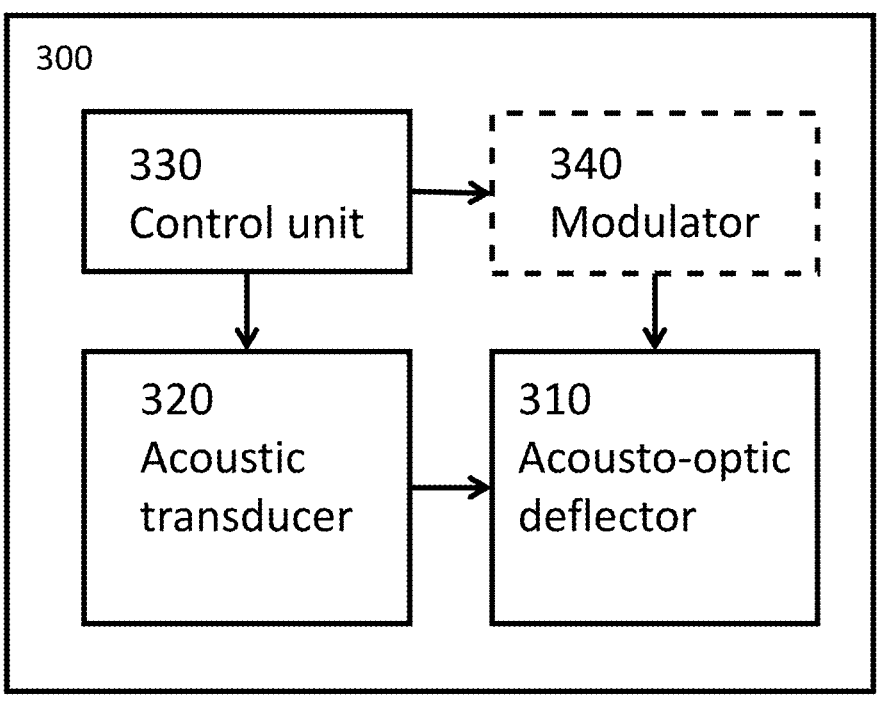
FIG. 3 shows a schematic diagram of an example of a device according to the present disclosure.

FIG. 3 shows a schematic diagram of an example of a device 300 according to the present disclosure. The device 300 comprises an acousto-optic deflector 310 arranged to receive the laser beam, and an acoustic transducer 320 arranged to provide acoustic waves to the acousto-optic deflector 310. The acousto-optic deflector 310 and the acoustic transducer 320 are generally provided as one physical unit but are illustrated as two separate boxes in FIG. 3 in view of their logically separate functionality. The device further comprises a control unit 330 arranged to vary the acoustic waves in frequency over time to vary a deflection angle of the laser beam over time thereby achieving a micro sweep of the laser beam. This is further described in relation to FIG. 1a.

The inventors have realised that the focus of the laser beam in the direction parallel with the micro sweep can be adapted by adapting differences in frequencies of the acoustic waves over a width of the laser beam in the direction parallel to the micro sweep when passing through the acousto-optic deflector 310. Specifically, adaptation to achieve desired focus is made by adapting the frequency of the acoustic waves over the micro sweep in relation to a linear increase of the frequency of the acoustic waves over time during the micro sweep (linear frequency ramp in the following). Furthermore, the error in the focus in the direction parallel with the micro sweep is not constant over the micro sweep. Hence, the error cannot be corrected by means of a further fixed lens or adaptation of existing fixed lenses.

Hence, the control unit 330 is further arranged to vary the acoustic waves in frequency over time in such a way that differences in frequencies of the acoustic waves in the acousto-optic deflector are caused over a width of the laser beam in a direction parallel to the micro sweep (the first direction Y in FIGS. 1a, 1b and 2) when passing through the acousto-optic deflector. The differences in frequencies are such that they cause a desired focus of the laser beam in a direction parallel with the micro sweep. Specifically, the speed (rate) of the variation (increase) in frequency of the acoustic waves is adapted over a time of the micro sweep such that adapted differences in frequencies over the time of the micro sweep of the acoustic waves are achieved over the time of the micro sweep that compensates for an erroneous focus of the laser beam in the direction parallel with the micro sweep over the micro sweep such that a desired (correct) focus of the laser beam in the direction parallel with the micro sweep can be achieved over the micro sweep. Preferably, the desired (correct) focus is constant (uniform) over the micro sweep. This is illustrated in FIG. 5a where focus error in the first direction Y is illustrated also for a case where calibration has been made to achieve the desired focus in the first direction Y as indicated by the curve designated "Flat Focus". It is to be noted that the focus error in the second direction X does not differ to any large extent between the case where calibration has been made to achieve a linear micro sweep and the case where calibration has been made to achieve a desired focus in the first direction Y.

By increasing the frequency of the acoustic waves provided from the acoustic transducer 320 to the acousto-optic deflector 310, differences in frequencies of the acoustic waves will be caused in the acousto-optic deflector, since at a given moment in time, acoustic waves of different frequencies will have travelled different distances into the acousto-optic deflector. Hence, there will be a momentary difference in frequency between acoustic waves in different portions of the acousto-optic deflector. Hence, by increasing the rate of the variation, e.g. increasing the frequency more per unit of time, the differences in frequencies over a same distance is increased in the acousto-optic deflector in a direction parallel with the micro sweep (the first direction Y in FIGS. 1a, 1b and 2). Correspondingly, by decreasing the rate of the variation, e.g. increasing the frequency less per unit of time, the differences in frequencies over a same distance is decreased in the acousto-optic deflector in a direction parallel with the micro sweep (the first direction Y in FIGS. 1a, 1b and 2).

The control unit 330 is preferably arranged to vary the acoustic waves in frequency over time in such a way the differences in frequencies are such that they cause the desired focus of the laser beam in the direction parallel with the micro sweep over the entire micro sweep. To achieve this, the control unit 330 is arranged to adapt the rate of variation (increase) of the frequency of the acoustic waves may over time to produce a difference in frequencies related to any given position along the entire micro sweep is such that it causes the desired focus of the laser beam in the direction parallel with the micro sweep in the given position.

A function may be derived mapping each point in time to a respective frequency. The function is such that in each point (moment) in time over the micro sweep a difference in frequencies of the acoustic waves is caused in the acousto-optic deflector over a width of the laser beam in a direction parallel to the micro sweep when passing through the acousto-optic deflector, where the difference in frequencies is such that it causes a desired focus of the laser beam in a direction parallel with the micro sweep. Since a desired focus is achieve in each point in time, the desired focus will also be achieved along the entire micro sweep.

For example, the frequency of the acoustic waves may be increased stepwise in 20 ns time intervals over a micro sweep lasting 1500 such time intervals. For each such 20 ns time interval, a frequency increase in relation to a previous time interval is iteratively identified using focus measurements in order to identify a frequency increase that achieves the desired focus of the laser beam in the first direction parallel to the micro sweep. Thus, a stepwise function of the frequency increase is derived achieving the desired focus. Other examples are feasible, such as using a continuous function for the increase of the frequency.

Figure 6A:
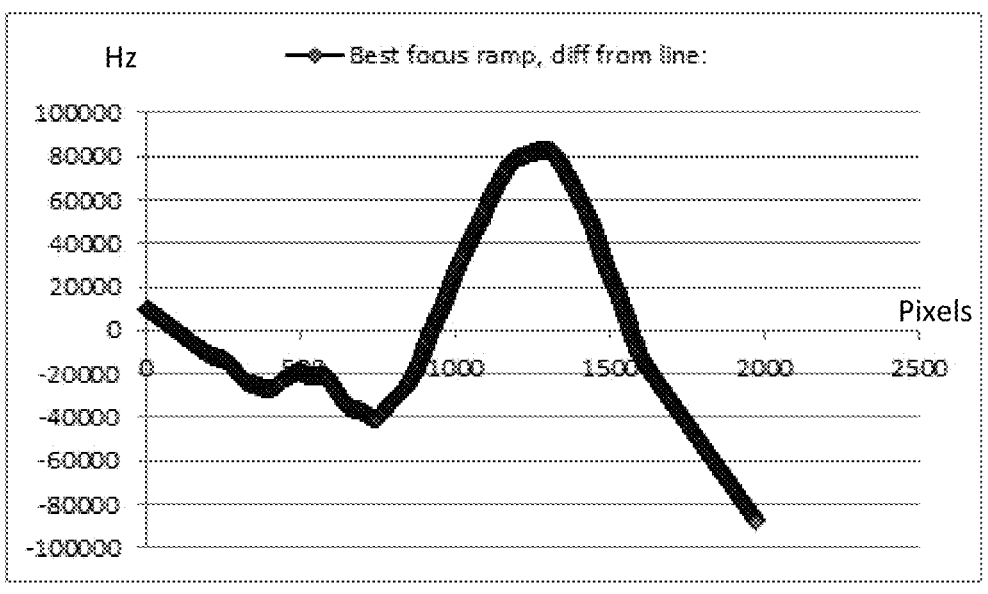
FIG. 6a and FIG. 6b show difference from a linear frequency ramp over a micro sweep of a laser beam in the first direction parallel to the micro sweep for a case where calibration has been made to achieve a desired focus in the first direction parallel to the micro sweep and for a case where calibration has been made to achieve a linear sweep, respectively.
Figure 6B:
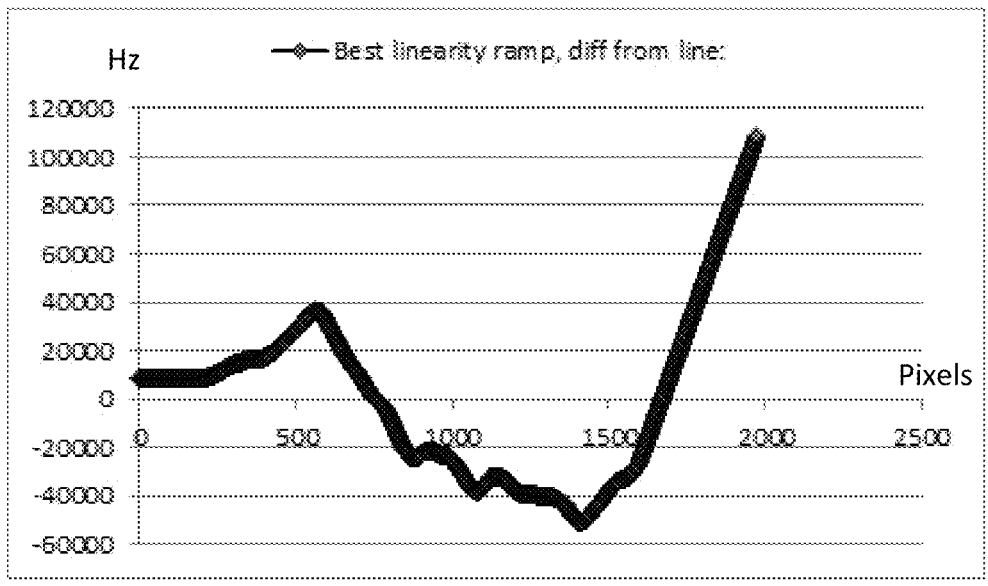

In alternative, a stepwise function can be derived for a difference in relation to a linear increase of the frequency. For each 20 ns time interval, a difference in frequency in relation to the linear increase is iteratively identified using focus measurements in order to identify the difference in frequency in relation to the linear increase that achieves the desired focus of the laser beam in the first direction parallel to the micro sweep. FIG. 6a shows the difference in Hz from a linear frequency ramp over a micro sweep for a case where calibration has been made to achieve a desired focus in the first direction parallel to the micro sweep, which in this is 2000 pixels long. As a comparison, FIG. 6b shows the difference in Hz from a linear frequency ramp over the micro sweep for a case where calibration has been made to achieve a linear sweep, where the micro sweep is 2000 pixels long.

The device 300 may further include a modulator 340 which modulates the laser beam over time according to a predetermined pattern to be used for printing on a photo-sensitive resist along the micro sweep. Generally, the predetermined pattern is rasterized in order to produce pattern data approximating the predetermined pattern in relation to a grid of pixels according to a cartesian coordinate system.

For a prior art solution where a pattern generator has been calibrated to produce a linear micro sweep, i.e. a micro sweep with constant speed of the laser beam over the photo-sensitive resist during the micro sweep, the modulation may be performed directly on the pattern data.

Figure 5B:
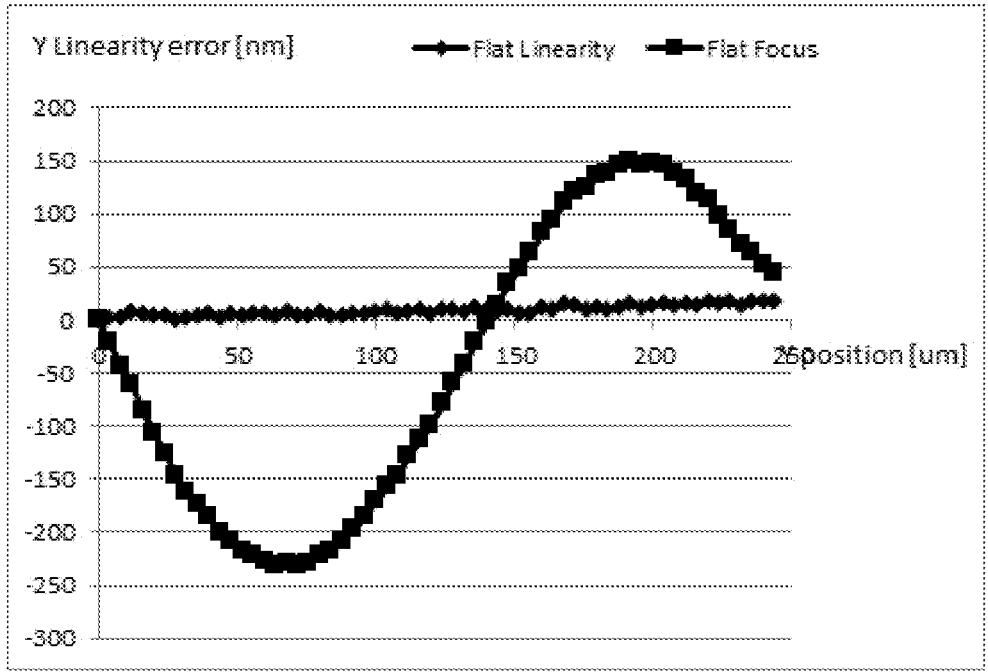
FIG. 5b shows linearity error along the micro sweep of the laser beam in the first direction parallel to the micro sweep for a case where calibration has been made to achieve a linear sweep and for a case where calibration has been made to achieve a desired focus in the first direction parallel to the micro sweep.

Varying the acoustic waves in frequency over time to achieve the desired focus of the laser beam in the direction parallel with the micro sweep will result in a rate of variation that varies over time. With a varying rate of variation, position nonlinearities will result for the micro sweep (nonlinear micro sweep), i.e. the position of the laser beam on the photo-sensitive resist in the micro sweep will not vary as a linear function of time. Such position nonlinearities need to be taken into account in order for printing to be at correct positions of the photo-sensitive resist. Depending on the specific apparatus, the absolute value of the difference in position as compared to a linear micro sweep may be in the order of the length of one pixel or larger. For example, for the calibration in relation to FIG. 5a achieving the desired focus in the first direction Y parallel with the micro sweep as indicated by the curve designated "Flat Focus", a difference in position as compared to a linear micro sweep will result. This is illustrated in FIG. 5b by the curve designated "Flat Focus" which shows the linearity error when calibration has been made to achieve the desired focus in the first direction Y. The linearity error is the error in distance in nanometres (nm) in relation to a linear micro sweep along the micro sweep which in respect to FIG. 5b is 250 micrometre (um). The linearity error in FIG. 5b is at its maximum almost 250 nm and a pixel may for example be 170 nm long. Hence, the error may be in the order of one or a few pixels.

This should be compensated for such that the error is in the order of only a fraction of a pixel at the most, e.g. a twentieth of a pixel. As a comparison, FIG. 5b also shows the linearity error for a case where calibration has been made to achieve a linear micro sweep as indicated by the curve designated "Flat Linearity" which consequently is close to zero along the entire micro sweep.

The modulator 340 may be controlled such that the modulation of the laser beam compensates for the change of position (position nonlinearities) within the micro sweep. Consider for example a previously determined modulation of the laser beam is based on a calibration for a linear micro sweep, i.e. where the position of the laser beam in the micro sweep varies as a linear function of time over the length of the micro sweep. Compensating for position nonlinearities could then be done by first determining a deviation in position over time of the non-linear micro sweep in relation to the linear micro-sweep and then adjust the previously determined modulation in relation to the deviation in position over time to produce a new modulation for the non-linear micro sweep.

Furthermore, the introduced position nonlinearities (non-linear sweep) will result in varying speed of the micro sweep (speed of the laser beam along the micro sweep) which in turn will affect the dose delivered along the sweep. The modulator 340 may be controlled such that this is taken into account by adapting an intensity of the laser beam over the micro sweep to compensate for the relative changes of speed within the micro sweep. For example, the intensity may be proportional to the speed of the micro sweep, i.e. the intensity is increased in portions of the micro sweep where the speed of the micro sweep is increased, and the intensity is decreased in portions of the micro sweep where the speed of the micro sweep is decreased.

Figure 4:
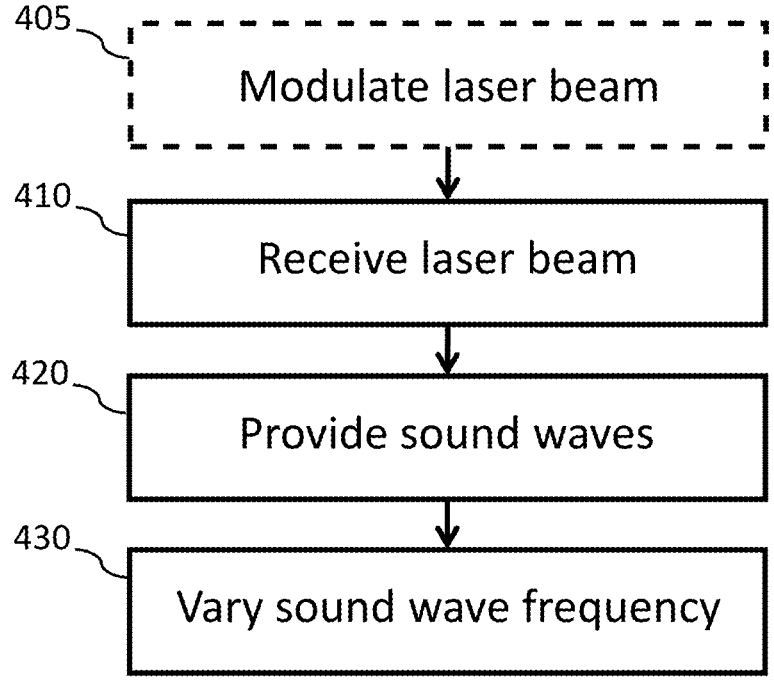
FIG. 4 shows a flow chart of an example of a method according to the present disclosure.

FIG. 4 shows a flow chart of an example of a method for controlling focus of a laser beam during a micro sweep according to the present disclosure. In the method, a laser beam is received 410 to an acousto-optic deflector. Furthermore, acoustic waves are provided 420 to the acousto-optic deflector. The acoustic waves are varied in frequency over time to vary a deflection angle of the laser beam over time thereby achieving the micro sweep of the laser beam. This is further described in relation to FIG. 1a. Specifically, a rate of variation in frequency of the acoustic waves is adapted over a time of the micro sweep in such a way that adapted differences in frequencies over the time of the micro sweep of the acoustic waves in the acousto-optic deflector are caused over a width of the laser beam in a direction parallel to the micro sweep (the first direction Y in FIGS. 1a, 1b and 2) when passing through the acousto-optic deflector. The adapted differences in frequencies over the time of the micro sweep are such that they cause a desired focus of the laser beam in a direction parallel with the micro sweep over the micro sweep.

The laser beam received to the acousto-optic deflector is typically modulated according to a predetermined pattern to be used for printing on a photo-sensitive resist along the micro sweep. Varying the acoustic waves in frequency over time to achieve the desired focus of the laser beam in the direction parallel with the micro sweep will result in position nonlinearities for the micro sweep (non-linear micro sweep), i.e. the position of the laser beam in the micro sweep will not vary as a linear function of time. The the modulation of the laser beam according to the method of the present disclosure may compensate 405 for position nonlinearities (change of position) within the micro sweep in order for printing to be at correct positions of the photo-sensitive resist according to the predetermined pattern.

The examples have been described in relation to an increase of the acoustic wave frequency causing deflection angle of the laser beam to vary thereby achieving the micro-sweep. This is because an increasing frequency of the acoustic waves is preferred. However, the principles are also applicable to a sweep achieved by a decreasing frequency of the acoustic waves resulting in a sweep in the opposite direction compared to when the frequency is increased.

The above description of examples is to be regarded as non-limiting. While specific examples have been described, it will be apparent to those having ordinary skill within the art that various changes, modifications or alterations are conceivable within the scope as defined in the appended claims.

Itemised List

1. A method for controlling focus of a laser beam during a micro sweep, the method comprising: receiving the laser beam to an acousto-optic deflector; and providing acoustic waves to the acousto-optic deflector, wherein the acoustic waves are varied in frequency over time to vary a deflection angle of the laser beam over time thereby achieving the micro sweep of the laser beam, wherein the acoustic waves are varied in frequency over time in such a way that differences in frequencies of the acoustic waves are caused in the acousto-optic deflector over a width of the laser beam in a direction parallel to the micro sweep when passing through the acousto-optic deflector, where the differences in frequencies are such that they cause a desired focus of the laser beam in a direction parallel with the micro sweep.

2. The method of item 1, wherein the differences in frequencies are such that they cause the desired focus of the laser beam in the direction parallel with the micro sweep over the entire micro sweep.

3. The method of any one of items 1 and 2, wherein the acoustic waves are varied in frequency over time according to a function which in each moment in time over the micro sweep causes a difference in frequencies of the acoustic waves in the acousto-optic deflector over a width of the laser beam in a direction parallel to the micro sweep when passing through the acousto-optic deflector, where the difference in frequencies is such that it causes a desired focus of the laser beam in a direction parallel with the micro sweep.

4. The method of any one of items 1-3, further comprising: modulating the laser beam over time according to a predetermined pattern, wherein the modulation of the laser beam is adapted to compensate for a change of position within the micro sweep due to the acoustic waves being varied in frequency over time in such a way that the desired focus of the laser beam in a direction parallel with the micro sweep is caused.

5. The method of any one of items 1-4, further comprising: adapting an intensity of the laser beam over the micro sweep to compensate for a change of speed of the micro sweep due to the acoustic waves being varied in frequency over time in such a way that the desired focus of the laser beam in a direction parallel with the micro sweep is caused.

6. A computer program comprising computer readable instructions that, when executed on a processing device, cause the processing device to perform the method of any one of items 1-5.

7. A computer readable medium having stored thereon a computer program comprising computer readable instructions that, when executed on a processing device, cause the processing device to perform the method of any one of claims 1-5.

8. A device for projection of a laser beam onto a surface, the device comprising: an acousto-optic deflector arranged to receive the laser beam; an acoustic transducer arranged to provide acoustic waves to the acousto-optic deflector; and a control unit arranged to vary the acoustic waves in frequency over time to vary a deflection angle of the laser beam over time thereby achieving the micro sweep of the laser beam, wherein the control unit is further arranged to vary the acoustic waves in frequency over time in such a way that differences in frequencies of the acoustic waves in the acousto-optic deflector are caused over a width of the laser beam in a direction parallel to the micro sweep when passing through the acousto-optic deflector, where the differences in frequencies are such that they cause a desired focus of the laser beam in a direction parallel with the micro sweep.

9. The device of item 8, wherein the differences in frequencies are such that they cause the desired focus of the laser beam in the direction parallel with the micro sweep over the entire micro sweep.

10. The device of any one of items 8 and 9, wherein the control unit is further arranged to vary the acoustic waves over time according to a function which in each moment in time over the micro sweep causes a difference in frequencies of the acoustic waves in the acousto-optic deflector over a width of the laser beam in a direction parallel to the micro sweep when passing through the acousto-optic deflector, where the difference in frequencies is such that it causes a desired focus of the laser beam in a direction parallel with the micro sweep.

11. The device of any one of items 8-10, further comprising: a modulator arranged to modulate the laser beam over time according to a predetermined pattern, wherein the modulation of the laser beam is adapted to compensate for a change of position within the micro sweep due to the control unit varying the acoustic waves in frequency over time in such a way that the desired focus of the laser beam in a direction parallel with the micro sweep is caused.

12. The device of any one of items 8-11, further comprising: means for adapting an intensity of the laser beam over the micro sweep to compensate for a change of speed of the micro sweep due to the control unit varying the acoustic waves in frequency over time in such a way that the desired focus of the laser beam in a direction parallel with the micro sweep is caused.

The invention claimed is:

1. A method for controlling focus of a laser beam during a micro sweep of the laser beam along a path on a surface to be exposed as a deflection angle of the laser beam varies by varying acoustic waves in frequency through an acousto-optic deflector, the method comprising:

receiving the laser beam to an the acousto-optic deflector, wherein the laser beam passes through the acousto-optic deflector; and providing the acoustic waves to the acousto-optic deflector, wherein the acoustic waves are varied in frequency over time to vary the deflection angle of the laser beam over the time thereby achieving the micro sweep of the laser beam, the micro sweep being a sweep of the laser beam along the path based on the variation of the deflection angle of the laser beam, wherein a rate of variation in frequency of the acoustic waves is adapted to vary over a time of the micro sweep in such a way that adapted differences in frequencies over the time of the micro sweep of the acoustic waves are caused in the acousto-optic deflector over a width of the laser beam in a direction parallel with the micro sweep when the laser beam is passing through the acousto-optic deflector, where the adapted differences in the frequencies over the time of the micro sweep are such that they cause a desired focus of the laser beam in the direction parallel with the micro sweep over the micro sweep.

2. The method of claim 1, wherein the adapted differences in frequencies over the time of the micro sweep are such that they cause the desired focus of the laser beam in the direction parallel with the micro sweep over an entirety of the micro sweep.

3. The method of claim 1, wherein the rate of variation in frequency of the acoustic waves is adapted over the time of the micro sweep according to a function which in each moment in time over the time of the micro sweep causes a difference in frequencies of the acoustic waves in the acousto-optic deflector over the width of the laser beam in the direction parallel with the micro sweep when passing through the acousto-optic deflector, where the difference in frequencies is such that it causes the desired focus of the laser beam in the direction parallel with the micro sweep.

4. The method of claim 1, further comprising:

modulating the laser beam over time according to a predetermined pattern, wherein the modulation of the laser beam is adapted to compensate for a change of position within the micro sweep due to the acoustic waves being varied in frequency over time in such a way that the desired focus of the laser beam in the direction parallel with the micro sweep is caused.

5. The method of claim 1, further comprising:

adapting an intensity of the laser beam over the micro sweep to compensate for a change of speed of the micro sweep due to the acoustic waves being varied in frequency over time in such a way that the desired focus of the laser beam in the direction parallel with the micro sweep is caused.

6. A computer program comprising computer readable instructions that, when executed on a processing device, cause the processing device to perform the method of claim 1.

7. A computer readable medium having stored thereon a computer program comprising computer readable instructions that, when executed on a processing device, cause the processing device to perform the method of claim 1.

8. A device for projection of a laser beam onto a surface, the device being adapted for controlling focus of the laser beam during a micro sweep of the laser beam along a path on the surface to be exposed as a deflection angle of the laser beam varies by varying acoustic waves in frequency, the device comprising:

an acousto-optic deflector arranged to receive the laser beam and to cause the laser beam to pass through the acousto-optic deflector;

an acoustic transducer arranged to provide acoustic waves to the acousto-optic deflector; and a control unit arranged to vary the acoustic waves in frequency over time through the acousto-optic deflector to vary the deflection angle of the laser beam over time thereby achieving the micro sweep of the laser beam, the micro sweep being a sweep of the laser beam along the path based on the variation of the deflection angle of the laser beam, wherein the control unit is further arranged to adapt a rate of variation of frequency of the acoustic waves to vary over a time of the micro sweep in such a way that adapted differences in frequencies over the time of the micro sweep of the acoustic waves in the acousto-optic deflector are caused over a width of the laser beam in a direction parallel with the micro sweep when the laser beam is passing through the acousto-optic deflector, where the adapted differences in frequencies over the time of the micro sweep are such that they cause a desired focus of the laser beam in a the direction parallel with the micro sweep over the micro sweep.

9. The device of claim 8, wherein the adapted differences in frequencies over the time of the micro sweep are such that they cause the desired focus of the laser beam in the direction parallel with the micro sweep over an entirety of the micro sweep.

10. The device of claim 8, wherein the control unit is further arranged to adapt the rate of variation in frequency of the acoustic waves over the time of the micro sweep according to a function which in each moment in time over the time of the micro sweep causes a difference in frequencies of the acoustic waves in the acousto-optic deflector over the width of the laser beam in the direction parallel with the micro sweep when passing through the acousto-optic deflector, where the difference in frequencies is such that it causes the desired focus of the laser beam in the direction parallel with the micro sweep.

11. The device of claim 8, further comprising:

a modulator arranged to modulate the laser beam over time according to a predetermined pattern, wherein the modulation of the laser beam is adapted to compensate for a change of position within the micro sweep due to the control unit varying the acoustic waves in frequency over time in such a way that the desired focus of the laser beam in the direction parallel with the micro sweep is caused.

12. The device of claim 8, further comprising:

means for adapting an intensity of the laser beam over the micro sweep to compensate for a change of speed of the micro sweep due to the control unit varying the acoustic waves in frequency over time in such a way that the desired focus of the laser beam in the direction parallel with the micro sweep is caused.

* * * * *